United States Patent [19]

Fayfield et al.

[11] Patent Number: 6,065,481
[45] Date of Patent: May 23, 2000

[54] DIRECT VAPOR DELIVERY OF ENABLING CHEMICAL FOR ENHANCED HF ETCH PROCESS PERFORMANCE

[75] Inventors: Robert T. Fayfield; John M. Heitxinger, both of St. Louis Park, Minn.

[73] Assignee: FSI International, Inc., Chaska, Minn.

[21] Appl. No.: 08/824,512

[22] Filed: Mar. 26, 1997

[51] Int. Cl.[7] .............................. B08B 6/00; H01L 21/302; B44C 1/22

[52] U.S. Cl. .............................. 134/1.3; 216/73; 216/80

[58] Field of Search ........................ 216/73, 80; 438/706; 134/1.3

[56] References Cited

U.S. PATENT DOCUMENTS

| | | | |
|---|---|---|---|
| 3,829,068 | 8/1974 | Hohne | 261/36 |
| 4,235,829 | 11/1980 | Partus | 261/121 |
| 4,605,479 | 8/1986 | Faith, Jr. | 204/192 |
| 4,749,440 | 6/1988 | Blackwood | 156/646 |
| 5,022,961 | 6/1991 | Izumi | 156/646 |
| 5,023,206 | 6/1991 | Freeman | 437/228 |
| 5,094,701 | 3/1992 | Norman et al. | 148/23 |
| 5,112,437 | 5/1992 | Watanabe et al. | 156/646 |
| 5,213,621 | 5/1993 | Ivankovits et al. | 134/3 |
| 5,213,622 | 5/1993 | Bohling et al. | 134/3 |
| 5,221,366 | 6/1993 | Roberts et al. | 148/22 |
| 5,234,540 | 8/1993 | Grant et al. | 156/646 |
| 5,332,444 | 7/1994 | Goerge et al. | 134/1 |
| 5,336,356 | 8/1994 | Ban et al. | 156/345 |
| 5,368,687 | 11/1994 | Sandhu et al. | 156/664 |
| 5,439,553 | 8/1995 | Grant | 216/58 |
| 5,455,014 | 10/1995 | Costantino et al. | 422/305 |
| 5,571,375 | 11/1996 | Izumi et al. | 156/646.1 |

FOREIGN PATENT DOCUMENTS

| | | |
|---|---|---|
| 8-115895 | 5/1996 | Japan . |
| 8-195381 | 7/1996 | Japan . |
| 94/27315 | 11/1994 | WIPO . |

OTHER PUBLICATIONS

C. Elsmore et al., "Comparison of HCL Gas–Phase Cleaning with Conventional and Dilute Wet Chemistries", *Electrochem. Soc. Proc.* (1995) 142–149.

P.J. Holmes et al., "A Vapor Etching Technique for the Photolithography of Silicon Dioxide," *Microelectronics and Reliability*, (1966) 337–341.

K. D. Beyer et al., "Etching of $SiO_2$ in Gaseous $HF/H_2O$," *IBM Technical Bulletin*, 19(7), (Dec. 1976), 2513.

A. Izumi et al., "A New Cleaning Method by Using Anhydrous $HF/CH_3OH$ Vapor System," J. Ruzyllo et al., ed. *Symposium on Cleaning Technology in Semiconductor Device Manufacturing*, ECS Proceedings, 92(12), 260–266 (1992).

Robert P. Donovan et al., "Semiconductor Wafer Cleaning Technology", Austin, TX, Feb. 23–24, 1993.

(List continued on next page.)

*Primary Examiner*—Benjamin L. Utech
*Assistant Examiner*—George Goudreau
*Attorney, Agent, or Firm*—Vidas, Arrett and Steinkraus

[57] ABSTRACT

Apparatus and method for direct delivery of enabling chemical gas from a liquid source and of HF gas in a hydrogen fluoride/enabling chemical based cleaning or etching process, such as a silicon dioxide film etching process. The liquid enabling chemical is temperature controlled to generate a vapor pressure which is sufficient to operate a mass flow controller at a desired processing pressure without a carrier gas. Prior to entering the process chamber, the enabling chemical gas is pre-mixed with HF and optionally, a carrier gas, all of which are supplied at flow rates independent of each other. By controlling the vapor pressure of the solvent in this way, solvent/HF/carrier mixtures which are not physically possible with carrier gas systems are attainable allowing access to a larger process space.

19 Claims, 2 Drawing Sheets

OTHER PUBLICATIONS

J. Butterbaugh et al., "Gas Phase Etching of Silicon Oxide with Anhydrous HF and Isopropanol;", *Proceedings of the Third International Symposium on Cleaning Technology in Semiconductor Device Manufacturing*, ECS Proceedings, 94(7), 374–383 (1994).

M. Jun–Ru, "A New Conformal Dry–etch Technique for Submicron Structures," *J. Vac. Sci. Technol.,* Nov./Dec. 1981, 1385–1389.

K.D. Beyer et al., "Silicon Surface Cleaning Process," *IBM Technical Disclosure Bulletin,* 20(5) (Oct. 1977), 1746–7.

DIRECT VAPOR DELIVERY OF ENABLING CHEMICAL FOR ENHANCED HF ETCH PROCESS PERFORMANCE

FIELD OF THE INVENTION

This invention relates to an apparatus for the gas phase etching of substrates using HF and an enabling chemical, and to an etching process for use in the manufacture of semiconductor devices, silicon based micromachines, flat panel displays, and the like.

BACKGROUND OF THE INVENTION

In the manufacture of semiconductor devices there are many process steps which involve removal of silicon oxide. A number of known protocols for silicon oxide etch use a gas phase mixture of HF and an enabling chemical.

Under reasonable conditions of temperature below about 100° C. and pressures of about 2 atmospheres or less, gas phase etch of silicon oxide is generally impractical without a second chemical which participates in some way to allow the etch reaction to proceed at a practical rate. A variety of enabling chemicals for facilitating silicon oxide removal with HF are known in the art, including water, alcohols, ketones and some carboxylic acids. Such compounds are liquids at ambient pressure and temperature. Similarly, U.S. Pat. Nos. 5,094,701, 5,221,366, 5,213,621, 5,213,622, and 5,332,444 describe techniques for gas phase removal of metals, metal nitrides or metal oxides which employ HF and a second chemical, such as a beta-diketone or beta-ketoimide, which functions complexing reagent to produce volatile metal-ligand complexes which then can be sublimed from the surface.

As used herein the term "enabling chemical" refers to such second chemicals. The term is not intended to imply any particular mechanism by which the enabling chemical operates in the overall etch scheme. The mechanism of action of the enabling chemical may vary depending on the enabling chemical used. For instance it may be conventionally catalytic, e.g. participating in some transition state but neither being created nor consumed in the overall reaction; autocatalytic, as in the case of water, which lowers the rate of etch initiation but is also a byproduct of the reaction so that reaction rate accelerates as the reaction proceeds; or as a classical coreactant, increasing the etch rate to a practical level because a different, more favored, reaction product is produced when the enabling chemical is present, or complexing with the HF reaction product to produce a volatile reaction product which can be removed in the gas phase.

It has long been known that gas phase HF/water mixtures can be used to etch various silicon oxide films. Early references include J. P. Holmes, et al, "A Vapor Etching Technique for the Photolithography of Silicon Dioxide," *Microelectronics and Reliability,* 5 pp 337–341 (1966); and K. Breyer, et al, "Etching of $SiO_2$ in Gaseous $HF/H_2O$, " *IBM Technical Bulletin,* 19(7) (12/1976), both of which used a HF/water azeotrope.

In U.S. Pat. No. 4,749,440 (Blackwood), a process for removing silicon oxide films from silicon wafers using anhydrous HF gas and water vapor carried in a nitrogen stream is disclosed. The gases are mixed just prior to entering a process chamber. The products are gaseous and are removed by the inert nitrogen carrier gas. This process has advantages over previous liquid phase etching procedures, in reducing heavy metals deposits which are often introduced during rinse steps, and in reducing environmental problems. Additionally, the use of anhydrous HF provides improved process control compared to prior gas phase HF/water processes in which HF is supplied as an azeotrope with water. An ambient pressure apparatus for performing this process is currently commercially available from FSI International, Inc., under the trademark Excalibur®.

Various publications describe gas-phase HF/alcohol processes for etching silicon oxide.

U.S. Pat. No. 5,022,961, (Izumi), describes a process for removing a film of a silicon oxide, from a silicon substrate. Two steps are identified:

(a) placing the substrate in a reaction chamber to be isolated in an air-tight manner from the outside air, and (b) feeding anhydrous hydrogen fluoride and alcohol simultaneously into the reaction chamber.

The reference indicates that the HF/alcohol feeds may be as liquid solutions or gas mixtures. A similar disclosure of an ambient pressure gas phase etch process is contained in A. Izumi, et al, "A New Cleaning Method by Using Anhydrous $HF/CH_3OH$ Vapor System," J. Ruzyllo et al, ed., *Symposium on Cleaning Technology in Semiconductor Device Manufacturing, ECS Proceedings,* 92(12), pp 260–266 (1992).

U.S. Pat. No. 5,439,553 (Grant, et al), issued Aug. 8, 1995 from an application filed in the United States on Mar. 30, 1994, describes and claims a low pressure process for removing silicon oxide from a wafer substrate in which an HF/alcohol gas mixture is used at a low pressure to minimize condensation. The same process was earlier published in printed course materials distributed to attendees of a short course entitled "Semi-Conductor Wafer Cleaning Technology" which was held in Austin, Tex. on Feb. 23rd and 24th, 1993, by Werner Kern Associates, East Windsor, N.J. At that short course, one of the inventors of U.S. Pat. No. 5,439,553 also presented a lecture on dry cleaning processes which included a discussion of vapor phase etching of silicon oxide using a HF/methanol process under low pressure conditions where condensation does not occur.

J. Butterbaugh, et al, "Gas Phase Etching of Silicon Oxide with Anhydrous HF and Isopropanol," *Proceedings of the Third International Symposium on Cleaning Technology in Semiconductor Device Manufacturing, ECS Proceedings,* 94(7) pp 374–383 (1994), describe a low pressure HF/isopropanol etch process for silicon oxide.

Low pressure processes generally are of increasing interest as cluster tools come into use in the semiconductor manufacturing industry. Cluster tools link a series of separate process modules via a central robotic handler, operating at a pressure of about 10 torr or less, allowing substrates such as silicon wafers to undergo multiple sequential processes without exposure to the environment. Such environmental isolation is becoming increasingly important as device features shrink, causing smaller and smaller contaminant regions to become problematic, and ultralarge scale integration increases the investment represented in each defective chip.

In all of the gas phase HF/enabling chemical systems heretofore described, whether operated at ambient pressure or low pressure, the enabling chemical has been provided in a manner which is dependent on a flow of carrier gas, for instance through a bubbler or in a spray vaporizer. None of the prior art systems have provided enabling chemical gas completely independent of a carrier gas flow. Such systems typically also provide an independent carrier gas flow so that a wider variation in HF/enabling chemical/carrier gas ratio is available. However, the adjustment of gas ratios can be quite complicated. For instance in one recently described system, U.S. Pat. No. 5,571,375, an alcohol enabling chemical gas is provided in part as a mixture with nitrogen carrier gas and in part as an azeotrope with HF produced by vaporization of an HF/alcohol solution with a nitrogen bubbler. Make up nitrogen is also provided.

In addition to the complication of such prior art systems, the amount of enabling gas supplied depends in part on the particular conditions of vaporization. Consequently, normal variations in the ambient pressure and temperature in the vaporization device can have significant impact on the proportion of enabling chemical gas in the carrier gas/enabling chemical gas mixture produced.

SUMMARY OF THE INVENTION

The present invention pertains to a simplified and enhanced apparatus and process for HF/enabling chemical etching or cleaning processes which is particularly advantageous for low pressure processing, especially processing at total gas pressures of below atmospheric pressure. The simplification of the apparatus and process results from utilizing direct supplies of both HF and enabling chemical gases, i.e. supplies which are independent of a carrier gas flow. This allows for reduction in the total volume of the carrier gas, even to the point of elimination, a feature of the invention which is particularly advantageous at subatmospheric pressure operating conditions.

In one aspect, the invention is an apparatus for gas phase etching or cleaning of a substrate using a HF/enabling chemical treatment process, the apparatus comprising:

a) a process chamber isolatable from the atmosphere for receiving and treating the substrate;

b) a gas supply system for providing an etching gas mixture in the process chamber, the gas supply system including i) a source of an inert carrier gas operable to optionally provide carrier gas to the process chamber at a flow rate determined by the user;

ii) a source of anhydrous HF gas operable to optionally provide HF gas to the process chamber at a flow rate independent of the carrier gas flow rate; and iii) a source of enabling chemical gas operable to optionally provide a enabling chemical gas at a flow rate independent of both the carrier gas and the HF gas flow rates.

A further aspect of the invention is a gas phase process for etching a substrate in a process chamber using a HF/enabling chemical system, characterized in that both the HF and enabling chemical gases are provided to the chamber at flow rates which are independently controlled relative to each other and to any carrier gas which may be employed.

In a particularly advantageous embodiment of the invention the system is operated at subatmospheric pressure, and the enabling chemical is provided at its source at a temperature high enough to provide a vapor pressure sufficient to operate a mass flow controller regulating the flow of enabling chemical gas from the source, but below the lowest temperature downstream of the source. The same condition can also advantageously be placed on the HF source. These conditions can easily be met by cooling the enabling chemical source, and optionally the HF source below ambient temperature and allowing the remaining system to operate at ambient temperature. In such systems the gas mixture can be provided to the process chamber at a flow rate independent of the ambient temperature, without danger of change due to condensation or varying concentration due to variations in the ambient temperature in different parts of the world.

Further aspects of the invention are described in the accompanying drawings and the following Description of the Preferred Embodiments.

DESCRIPTION OF THE PREFERRED EMBODIMENTS

Figure 1:
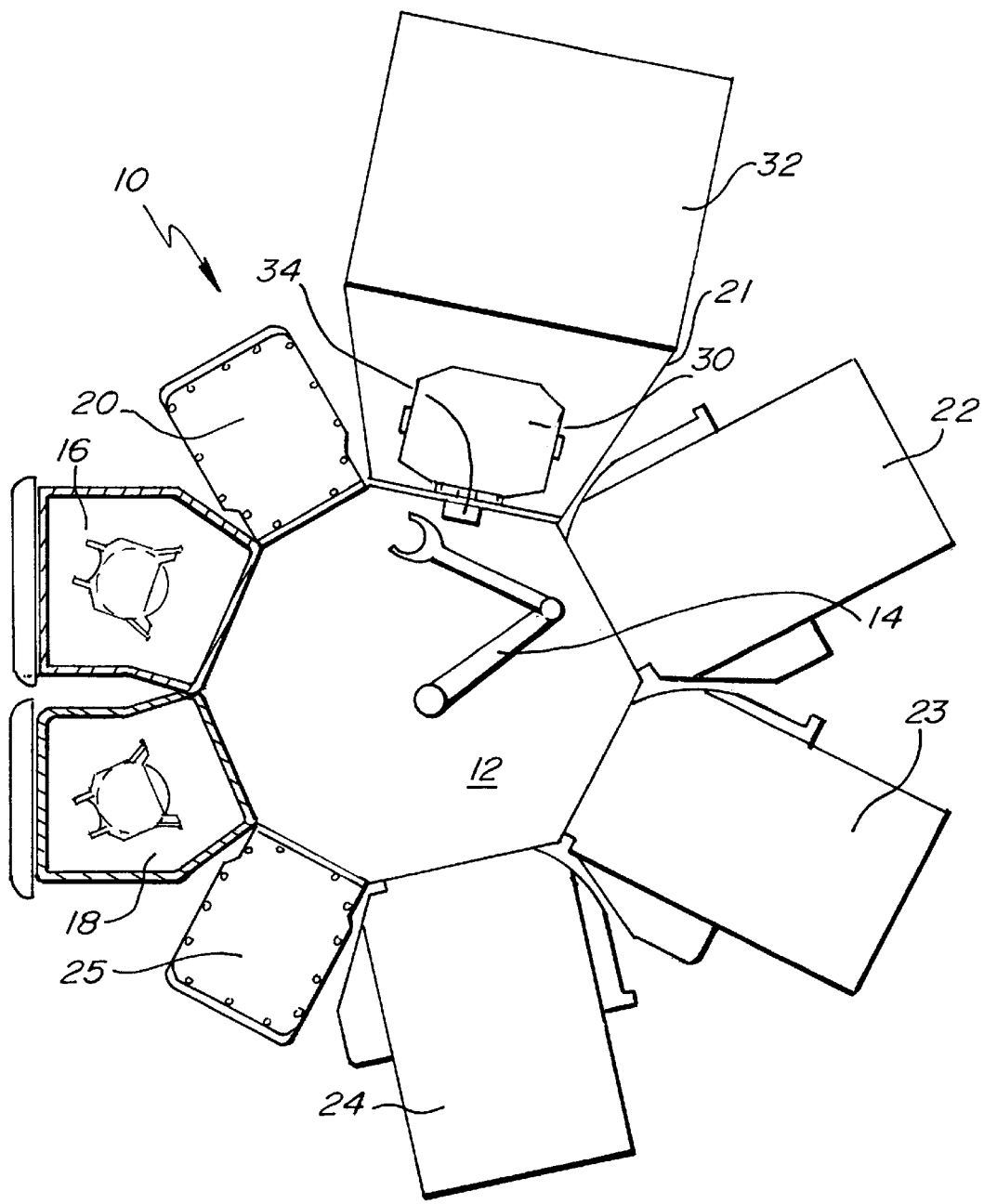
FIG. 1 is a schematic top plan view with parts cut away of a cluster tool which includes a process module embodying an apparatus of the present invention.

Referring to FIG. 1, a cluster tool generally designated by the numeral 10 is shown. Cluster tool 10 includes a central handler 12 in which a robotic transfer tool 14 is housed under vacuum. Surrounding the handler 12 are entry and exit modules 16, 18, via which substrates may enter and leave the tool without disrupting the vacuum of the handler and a series of process modules 20–25 into and out of which the handler moves the substrates and in which the substrates are subjected to various chemical processes.

Process module 21 includes a processing chamber 30 for HF/enabling chemical etching in accordance with the present invention. The process module 21 also includes a control unit 32, which includes process controls, plumbing and chemicals as needed to control and service the process tool according to a programmed control sequence. A gate valve 34 is provided as an integral part of the handler or the process module 21 or as a separate intermediate assembly. The gate valve functions as an entry and exit port through which the substrate, suitably a silicon wafer, is transferred between the handler 12 and the process module 21 by the transfer tool 14. The handler is typically operated at a pressure of about $10^{-4}$–50 torr and may be purged with nitrogen.

Figure 2:
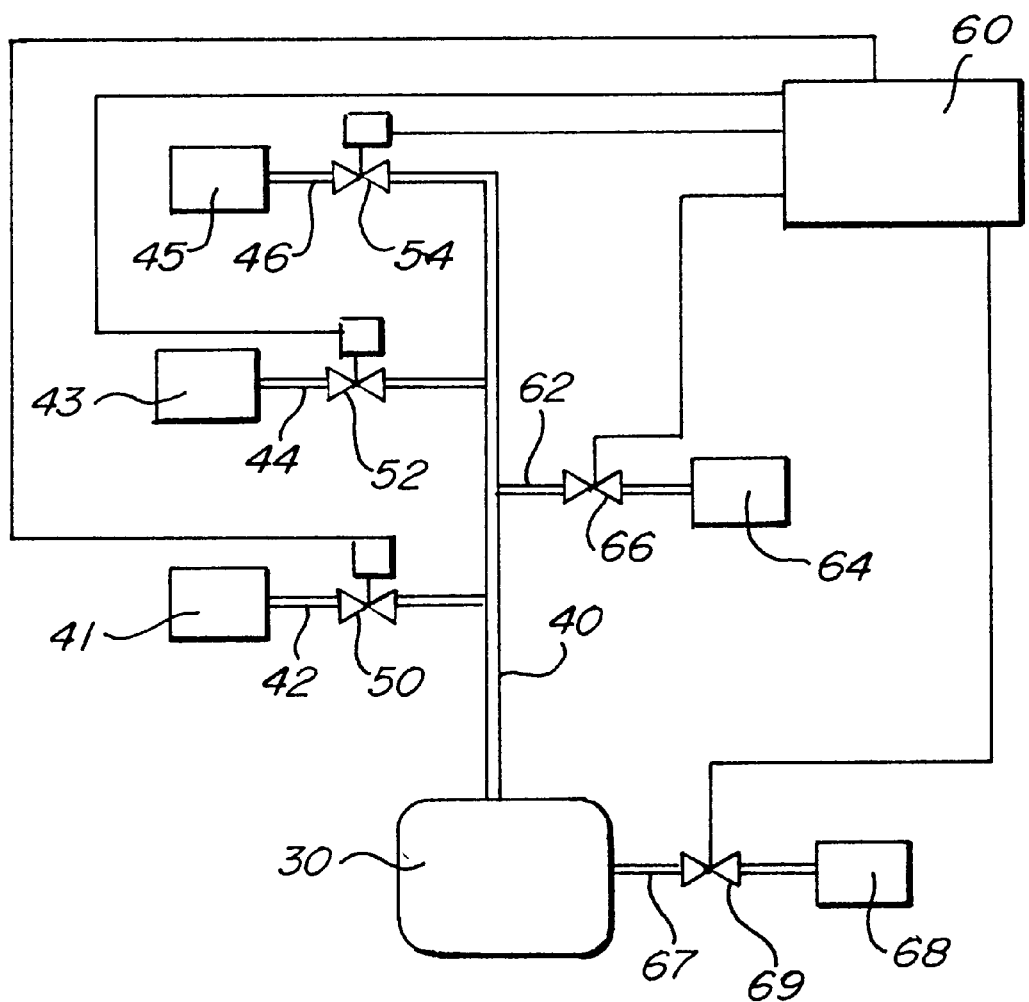
FIG. 2 is a block diagram of an apparatus of the present invention.

Referring to FIG. 2, the apparatus of the invention is illustrated in block diagram form. A processing chamber 30 is supplied with processing gas via feed line 40. Connected to line 40 are separate lines 42, 44, 46 leading respectively to sources 41, 43, 45 of, respectively, anhydrous HF, a gas phase enabling chemical and a carrier gas such as nitrogen. Flow through lines 42, 44 and 46 are controlled respectively by mass flow controllers 50, 52 and 54, each of which is operated by a programmable computing unit 60 using a suitable electrical, radio or other communication signal means. Also connected to line 40 via line 62 is a vacuum source 64. Valve 66, also operated by computing unit 60, regulates operation of the vacuum to allow purging of line 40. Another valve 69, operated by computing unit 60, provides a controllable connection between vacuum source 68 and chamber 30 via line 67. Vacuum source 68 provides primary system pumpdown and maintenance of the operating pressure during processing.

The feed line system from the enabling chemical and HF mass controllers to the processing chamber may be heated to prevent condensation of either or both components, particularly when operated with little or no diluting carrier gas. However in a particularly advantageous embodiment of the invention the enabling chemical source 43, and optionally the HF source 41, are provided with a cooling system which allows the source temperature to be kept below that of the feed line system and processing chamber. As long as these sources are not cooled so low that the vapor pressure is insufficient to drive the mass flow controller, such cooling will allow the apparatus to be constructed without line heaters. Also, when the process is run at ambient temperature (as is typical for the processes of primary commercial interest), such a cooled source system allows the apparatus to be utilized effectively anywhere in the world without concern that variation in ambient temperature might require modification to prevent line or chamber condensation problems.

In operation as part of a cluster tool 10, the gate valve 34 is opened and the substrate is deposited in the processing chamber 30 by the robotic transfer tool 14 of the central handler 12. The processing chamber is then isolated from the handler by closing the gate valve 34 and the environment of the chamber pumped below that of the handler. The chamber is then backfilled with nitrogen to a predetermined pressure and the HF and enabling chemical feeds initiated for a time and at respective flow rates as needed for the particular etch process being performed. Upon completion of the processing sequence the chamber is again evacuated below handler pressure and backfilled with nitrogen to approximately handler pressure before the substrate is removed and transferred to another station of the cluster tool.

Although described above in connection with a silicon wafer substrate, other substrates may also be employed in the invention. For instance substrates of other semiconductor materials such as SiGe; as well as flat panels; magnetic media and disk drive parts may require an etch operation for which the inventive process and apparatus is particularly suited.

Because the apparatus of the invention does not require carrier gas to provide either the HF or enabling chemical feeds, the total volume of the carrier gas employed during the processing operation can be reduced, even to the point of elimination. This means that at any given pressure the partial pressures of the reactive HF and enabling chemical gases will be proportionately higher, thereby allowing higher etch rates at pressures closer to the handler pressure. As a result the pumpdown and backfill times can be reduced, facilitating higher throughput for the processing operation.

As noted above, a particularly advantageous embodiment of the invention is that the system is operated at subatmospheric pressure, and the enabling chemical is provided at its source at a temperature high enough to provide a vapor pressure sufficient to operate the mass flow controller regulating the flow of enabling chemical gas from the source, but below the lowest temperature downstream of the source. The same condition can also advantageously be placed on the HF source. In such systems the gas mixture can be provided to the process chamber at a flow rate independent of the ambient temperature, without danger of change due to condensation or varying concentration due to variations in the ambient temperature or pressure. So long as the temperature downstream of the source is higher than at the source, the gases can be metered by mass flow to the process chamber without carrier gas. These conditions can easily be met by cooling the enabling chemical source, and optionally the HF source below ambient temperature and allowing the remaining system to operate at ambient temperature. No heating of the supply lines to the process chamber is required under these circumstances, so that the apparatus and its control are further simplified, without any loss of control of the process repeatability.

The process and direct enabling chemical delivery apparatus of the invention may be employed advantageously over a wide range of process parameters. For example, for a silicon oxide etch using HF and an enabling chemical of ROH (where R is H or alkoxy), process pressure may be varied over the range of 1 torr to 1 atm, with a range of from about 10 to about 500 torr being preferred; total gas flow may range from 200 sccm to 5000 sccm; the gas mixture ratio may be varied from 0 to 100% enabling chemical, 0 to 100% HF, and 0–100% carrier gas; the process time may be varied from 1 sec up to tens of minutes, depending on amount of material to be removed and the other process parameters selected; and the process temperature may range from about 20 to about 100° C.

In addition to enabling chemicals such as water, and alcohols such as methanol, ethanol and isopropanol, other organic liquid HF etch enabling chemicals may be used. For instance ketones, such as acetone and methyl ethyl ketone; aldehydes, such as formaldehyde and acetaldehyde; and carboxylic acids, such as formic acid and acetic acid; can be useful in some circumstances. Isopropanol is preferred.

In addition to nitrogen carrier gas, other carrier gases inert to the etching reaction may also be used, for instance the noble gases helium, neon, argon, krypton or xenon.

In addition to removing silicon oxide materials, the HF/enabling chemical combination may be one which accomplishes removal of other metal or metalloid oxide or nitride compounds, especially TiO, various aluminum oxides, TiN, and TaO. For some such applications the enabling chemical may be a ligand-forming compound such as a beta-diketone or another compound disclosed in U.S. Pat. Nos. 5,094,701, 5,221,366, 5,213,621, 5,213,622, 5,332,444 or 5,368,687 all incorporated herein by reference.

If the apparatus is desired to be operated exclusively without carrier gas the skilled person will recognize that the source of carrier gas can be eliminated from the apparatus without departing from the invention hereof.

The invention is illustrated by the following non-limiting examples

EXAMPLES

A processing apparatus as shown in FIG. 2 was employed in these Examples. HF/IPA silicon dioxide etching processes, chosen to give comparable etch rates, were run both with and without $N_2$ carrier gas in the mixture. The latter is only possible with the direct enabling chemical delivery system of the invention. The substrates (6" silicon wafers) were covered with about 4000 Å of thermal oxide. In each process, the oxide was partially consumed (<1000 Å) by the HF/IPA etch step. The resulting oxide etch uniformity and oxide etch rate was measured with a mapping (49 pts) spectrometer.

The following parameters were used for the oxide etch processes:

Wafer temperature=45° C.

Etch Time=60 sec

Other process conditions and etch rate and etch uniformity results are given in Table 1.

TABLE 1

| Gas Mixture | Pressure (Torr) | Gas Volume Ratios (HF:$N_2$:IPA) | Flow (sccm) | Etch Rate (nm/min) | Etch Uniformity (1σ%) |
|---|---|---|---|---|---|
| HF/$N_2$/IPA* | 90 | 25:25:1 | 2000 | 44 | 2.1% |
| HF/IPA | 75 | 25:0:1 | 1000 | 47 | 1.2% |

*IPA = isopropyl alcohol

The process run without the $N_2$ carrier gas gave enhanced performance both in terms of within wafer oxide etch uniformity and a lower allowable process pressure (see Table 1, above). The first advantage, enhanced uniformity, is always desirable in semiconductor manufacturing processes. The second advantage, lower process pressure for a given etch rate, allows the process to be run at a pressure which is closer to the cluster transfer pressure. This in turn reduces the gas backfill and pumpout times so process throughput can be increased.

While this invention may be embodied in many different forms, there are shown in the drawings and described in detail herein specific preferred embodiments of the invention. The present disclosure is an exemplification of the principles of the invention and is not intended to limit the invention to the particular embodiments illustrated. Those skilled in the art may recognize other equivalents to the specific embodiment described herein which equivalents are intended to be encompassed by the claims attached hereto.

What is claimed is:

1. A process for etching or cleaning a substrate in a process chamber using a gaseous HF/enabling chemical mixture, the process characterized in that both the HF and enabling chemical gases are provided to the process chamber at flow rates which are independently controlled relative to each other and to any carrier gas which may be employed wherein the enabling chemical gas is provided to the process chamber via a conduit line from a tank containing a volume of said enabling chemical compound in liquid form, the process chamber and conduit line having a temperature and the liquid enabling chemical in said tank being cooled to a temperature below the temperature of said conduit line and said process chamber.

2. A process as in claim 1 wherein the temperature of the line and of the process chamber is ambient temperature.

3. A process as in claim 1 wherein the enabling chemical compound is water or an organic compound selected from the group consisting of alcohols, aldehydes, ketones and carboxylic acids.

4. A process as in claim 1 wherein the HF/enabling chemical gas mixture is provided to the processing chamber at a total pressure of from about 10 torr to about 500 torr.

5. A process as in claim 1 wherein the HF/enabling chemical gas mixture is prepared outside said processing chamber and then fed to the processing chamber.

6. A process as in claim 1 wherein the HF/enabling chemical gas mixture provided to the processing chamber is free of a carrier gas.

7. A process for etching or cleaning a substrate in a process chamber using a gaseous HF/enabling chemical mixture, the process characterized in that both the HF and enabling chemical gases are provided to the process chamber at flow rates which are independently controlled relative to each other and to any carrier gas which may be employed wherein an inert carrier gas is also provided to the processing chamber at a flow rate independent of the HF/enabling chemical gases.

8. A process as in claim 7 wherein the carrier gas is nitrogen and the enabling chemical gas is methanol, ethanol, isopropanol, acetone, methyl ethyl ketone, formaldehyde, acetaldehyde, formic acid or acetic acid.

9. A process as in claim 1 wherein the process is utilized to remove silicon oxide from the substrate.

10. A process as in claim 1 wherein the substrate is a silicon wafer, a SiGe wafer, a flat panel display device, a magnetic media or a disk drive part.

11. A process as in claim 7 wherein the HF/enabling chemical gas mixture is provided to the processing chamber at a total pressure of from about 10 torr to about 500 torr.

12. A process as in claim 7 wherein the HF/enabling chemical gas mixture is prepared outside said processing chamber and then fed to the processing chamber.

13. A process for etching or cleaning a substrate in a process chamber using a gaseous HF/enabling chemical mixture, the process characterized in that both the HF and enabling chemical gases are provided to the process chamber at flow rates which are independently controlled relative to each other and to any carrier gas which may be employed wherein the enabling chemical gas is provided to the process chamber via an enabling chemical conduit line and conduit line from a tank containing a volume of said enabling chemical compound in liquid form, the HF gas is provided to the process chamber via an HF conduit line and a conduit line from a source the process chamber and conduit line having a temperature, and at least one of the liquid enabling chemical in said tank and the gaseous HF is cooled to a temperature below the temperature of conduit line and said process chamber.

14. The process of claim 13 wherein the gaseous HF is cooled to a temperature below the temperature of conduit line and said process chamber.

15. A process as in claim 13 wherein the enabling chemical compound is water or an organic compound selected from the group consisting of alcohols, aldehydes, ketones and carboxylic acids.

16. A process as in claim 13 wherein the HF/enabling chemical gas mixture is provided to the processing chamber at a total pressure of from about 10 torr to about 500 torr.

17. A process as in claim 13 wherein the HF/enabling chemical gas mixture is prepared outside said processing chamber and then fed to the processing chamber.

18. A process as in claim 13 wherein the HF/enabling chemical gas mixture provided to the processing chamber is free of a carrier gas.

19. A process as in claim 7 wherein the enabling chemical compound is water or an organic compound selected from the group consisting of alcohols, aldehydes, ketones and carboxylic acids.

* * * * *